United States Patent
Ishizuka

(10) Patent No.: US 6,473,327 B1
(45) Date of Patent: Oct. 29, 2002

(54) SEMICONDUCTOR MEMORY HAVING A PAIR OF BANK SELECT DRIVERS DRIVING EACH BANK SELECT LINE

(75) Inventor: Nobuhiko Ishizuka, Tokyo (JP)

(73) Assignee: NEC Corporation, Tokyo (JP)

( * ) Notice: Subject to any disclaimer, the term of this patent is extended or adjusted under 35 U.S.C. 154(b) by 22 days.

(21) Appl. No.: 09/709,204

(22) Filed: Nov. 9, 2000

(30) Foreign Application Priority Data

Nov. 9, 1999 (JP) ............................................ 11-318782

(51) Int. Cl.[7] ............................................. G11C 17/00
(52) U.S. Cl. ...................... 365/103; 365/63; 365/230.03
(58) Field of Search ..................... 365/63, 94, 103–104, 365/210, 230.03, 230.06–230.08, 203

(56) References Cited

U.S. PATENT DOCUMENTS

| | | | | |
|---|---|---|---|---|
| 5,349,563 A | * | 9/1994 | Iwase | 365/103 |
| 5,886,937 A | * | 3/1999 | Jang | 365/203 |
| 5,909,405 A | * | 6/1999 | Lee et al. | 365/63 |
| 6,069,831 A | * | 5/2000 | Jang et al. | 365/210 |
| 6,072,734 A | * | 6/2000 | Choi | 365/104 |
| 6,088,277 A | * | 7/2000 | Kim et al. | 365/104 |

\* cited by examiner

*Primary Examiner*—David Nelms
*Assistant Examiner*—Gene N. Auduong

(57) ABSTRACT

A semiconductor memory comprises a memory cell array having a plurality of rows and a plurality of columns, a plurality of word lines each connected to a gate of memory cells of a corresponding row in the memory cell array, and a plurality of bit lines each connected to a connection node between a source of memory cells of a corresponding column in the memory cell array and a drain of memory cells of an adjacent column. Each word line is connected to a corresponding output of a row address decoder, and each bit line is connected through a switching transistor to a corresponding digit line which is connected through a column selector controlled by a column address decoder, to a sense amplifier or a precharge circuit. Each switching transistor is on-off controlled by a corresponding bank select line. A pair of bank select drivers are located at opposite end sides of each bank select line, respectively, and are connected to opposite ends of each bank select line, respectively, for raising up the bank select line in accordance with an address fetched in response to a column address strobe signal.

14 Claims, 4 Drawing Sheets

SEMICONDUCTOR MEMORY HAVING A PAIR OF BANK SELECT DRIVERS DRIVING EACH BANK SELECT LINE

BACKGROUND OF THE INVENTION

The present invention relates to a semiconductor memory such as a read only memory, and more specifically to such a semiconductor memory configured to have an elevated reading speed.

Conventionally, a mask ROM (read only memory) is used as one type of semiconductor memory. This mask ROM includes a synchronous ROM operating in synchronism with a supplied clock signal, A typical synchronous mask ROM comprises a number of memory cells having a flat cell structure, arranged to constitute a NOR type cell array. In this NOR type cell array, a plurality of word lines are arranged to extend in a row direction (X-direction) so that memory cells included in one row are connected to a corresponding word line, and a plurality of bit lines are arranged to extend in a column direction (Y-direction) so that memory cells included in one column are connected to a corresponding bit line. The bit lines are paired, and each pair of bit lines are connected through an interconnection section to one digit line, which is connected to a sense amplifier and precharge circuit. In addition, a plurality of bank selection lines are located orthogonally to the bit lines to on-off control a transistor which is located in the interconnection section and is connected between each bit line and a corresponding digit line.

An X-decoder for the NOR type cell array fetches an address in response to a RAS (row address strobe) signal, and one bank select driver is connected to the X-decoder. A Y-decoder for the NOR type cell array fetches an address in response to a CAS (column address strobe) signal.

In the above mentioned synchronous mask ROM of the NOR type, 13 bits are allocated for a RAS address, and the number of bits of a CAS address is determined by the memory capacity of the NOR type cell array.

In addition, the word lines and the bank selection lines are formed of polysilicon, and the digit lines are formed of aluminum. Therefore, a signal propagation speed on the word lines and the bank selection lines is slower than a speed for selecting the digit line. In the prior art, therefore, an address for selecting the word line and the bank selection line are allocated to the RAS address.

However, since the number of bits for the RAS address is as small as 13, the address is insufficient, and therefore, it was necessary to allocate the bank select lines for the CAS address. In this case, the speed for fetching the address in response to the CAS signal is determined by a bank selector.

Furthermore, in the synchronous mask ROM of the NOR type so configured that an X address is fetched in response to the RAS signal and a Y address is fetched in response to the CAS signal, one problem in speeding up is how fast the digit lines and the bit lines are precharged.

Therefore, it may be considered to elevate the performance of the precharge circuits for precharging the digit lines and the bit lines. However, the elevation of the performance of the precharge circuits causes another problem in which a current becomes too large or a current flowing out of the sense amplifier becomes too small, with the result that a delicate attention must be paid for adjustment of the precharge circuit.

BRIEF SUMMARY OF THE INVENTION

Accordingly, it is an object of the present invention to provide a semiconductor memory which has overcome the above mentioned problems of the prior art.

Another object of the present invention is to provide a semiconductor memory having an increased data reading speed.

The above and other objects of the present invention are achieved in accordance with the present invention by a semiconductor memory comprising:

a memory cell array including a number of memory cells arranged in a matrix having a plurality of rows and a plurality of columns;

a plurality of word lines each connected to a plurality of memory cells of a corresponding row of the plurality of rows in the memory cell array;

a plurality of bit lines each connected to a plurality of memory cells of a corresponding column of the plurality of columns in the memory cell array;

a row address decoder fetching an address in response to a row address strobe signal to decode the fetched address and to select one word lines from the plurality of word lines;

a column address decoder fetching the address in response to a column address strobe signal to decode the fetched address;

a column selection switch receiving the decoded address from the column address decoder for selecting one bit line from the plurality of bit lines;

a sense amplifier for precharging the bit line of a memory cell selected by the row address decoder and the column address decoder;

a precharge circuit for precharging the bit line of a non-selected memory cell; and a pair of bank select drivers fetching the address in response to the column address strobe signal for raising up a bank select line for turning on a switch between the bit lines and a digit line, the pair of bank select drivers being located at opposite end sides of the bank select line, respectively.

With this arrangement, in response to the row address strobe signal, the row address decoder fetches the address to decode the fetched address and to select and activate one word line from the plurality of word lines. Then, in response to the column address strobe signal, the column address decoder fetches the address to decode the fetched address and to select one bit line from the plurality of bit lines by use of the column selection switch. Thus, one memory cell is selected by the given address. Furthermore, the address is fetched in response to the column address strobe signal, so that the bank select drivers located at the opposite end sides of the bank select line selected in accordance with the address are driven to activate or rise up the selected bank select line. Thus, a current flows from the sense amplifier through the bit line to the selected memory cell, so that the bit line of the selected memory cell is precharged. In addition, a current flows from the precharge circuit through the bit line to the selected memory cell, so that a non-selected bit line is precharged. Accordingly, the bit lines having a large capacitance is further quickly or surely precharged, with the result that the data reading operation from the fetching of the address to a data latching of an output stage can be quickened.

In one embodiment of the semiconductor memory, one of the pair of bank select drivers is located at a row address decoder side of the memory cell array, and the other of the pair of bank select drivers is located at a side of the memory cell array opposite to the row address decoder side.

Preferably, the semiconductor memory can further include a reference cell having the same structure as that of the memory cells and connected to the sense amplifier for supplying a reference voltage used for discriminating which of a high level and a low level an output of the selected memory cell is.

In a specific embodiment of the semiconductor memory, the memory cell array is of the NOR type. More specifically, the memory cells are of a flat cell structure.

In addition, the sense amplifier can receive an equalizing signal for changing over the sense amplifier between an activated condition and a deactivated condition.

The above and other objects, features and advantages of the present invention will be apparent from the following description of preferred embodiments of the invention with reference to the accompanying drawings.

DETAILED DESCRIPTION OF THE INVENTION

Now, an embodiment of the semiconductor memory in accordance with the present invention will be described with reference to the accompanying drawings.

Figure 1:
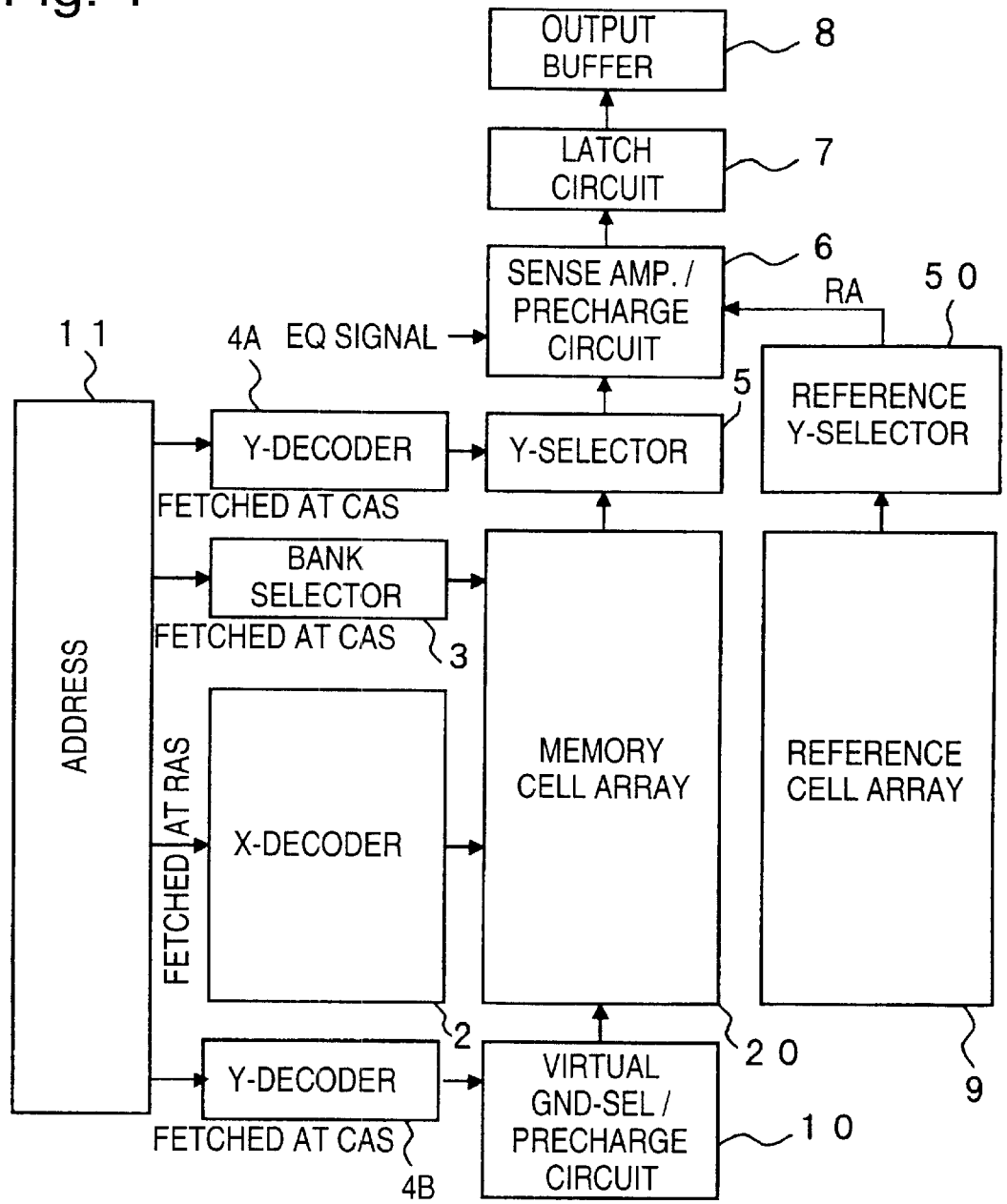
FIG. 1 is a block diagram of an embodiment of the semiconductor memory in accordance with the present invention.
Figure 2:
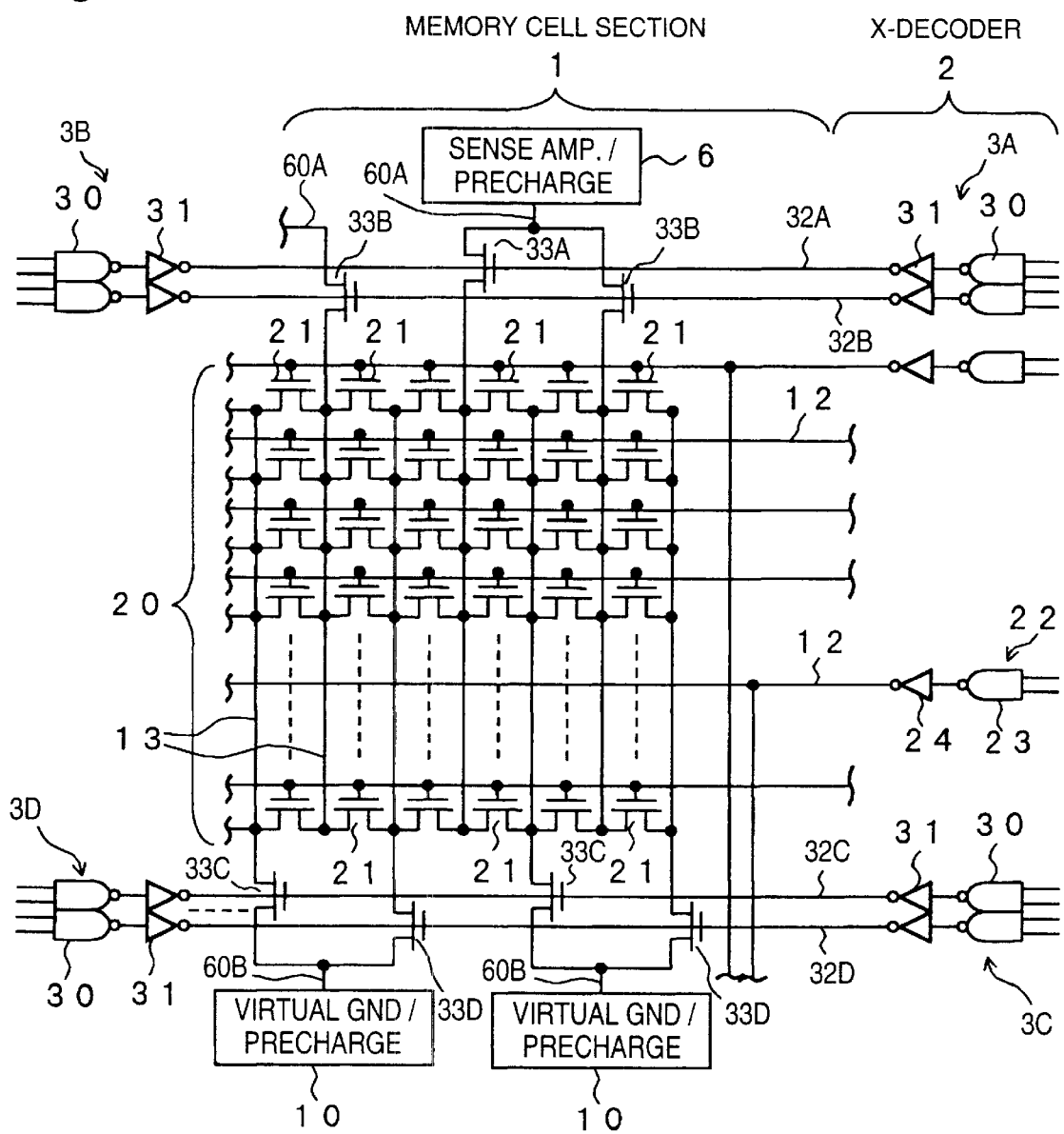
FIG. 2 is a partial circuit diagram of the embodiment of the semiconductor memory in accordance with the present invention.

Referring to FIG. 1, there is shown a block diagram of an embodiment of the semiconductor memory in accordance with the present invention. FIG. 2 is a partial circuit diagram of the semiconductor memory shown in FIG. 1. The shown embodiment is a NOR type synchronous mask ROM having the flat cell structure.

As shown in FIGS. 1 and 2, the shown semiconductor memory comprises a memory cell section 1 including a memory cell array 20 composed of a number of memory cells 21 arranged in a matrix having a plurality of rows and a plurality of columns. As seen from FIG. 2, each memory cell 21 is constituted of a field effect transistor, more specifically, a MOS transistor. In addition, a source of each memory cell is connected to a drain of adjacent memory cell so that a plurality of memory cells are arrayed in each row, and a plurality of rows thus formed are arranged. A gate of the memory cells arrayed in each row is connected to one word line 12, and therefore, the number of the word lines 12 is equal to the number of the rows. A source or a drain of the memory cells arrayed in each column is connected to one bit line 13, and therefore, the number of the bit lines 13 is equal to the number obtained by adding one to the number of the columns. Except for a leftmost bit line and a rightmost bit line shown in FIG. 2, each bit line is connected to a connection node between a source of the memory cells at a right side of the bit line and a drain of the memory cells at a left side of the bit line.

Furthermore, an X-decoder 2 for fetching an address 11 in response to a RAS signal to decode the fetched address and to select one word line 12, is located at one side of the memory cell array 2. The X-decoder includes circuits 22 of the number equal to that of the word lines 12. Each of the circuits 22 comprises a NAND circuit 23 for receiving the address (only two inputs are shown in FIG. 2 for simplification of the drawing) and an inverter 24 having an input connected to an output of the NAND circuit 23 and an output connected to a corresponding word line. The fetched address is supplied to all the circuits 22, so that only one of the circuits 22 is activated to rise up its output, with the result that one word line connected to the raised-up output of the activated circuit 22 is selected in accordance with the fetched address.

The shown semiconductor memory further comprises a Y decoder 4A for fetching the address 11 in response to a CAS signal to decode the fetched address and to generate an output signal to a Y-selector 5, which is connected to the memory cell array 20 for selecting one column of the memory cell array 20, thereby to select one memory designated by the supplied address. This Y selector 5 is connected with a sense amplifier and precharge circuit 6 for precharging a digit line 60A selected on the basis of the output signal from the Y decoder 4A and for sensing and amplifying an output of a selected memory cell 21. The Y selector 5 is omitted in FIG. 2 for simplification of the drawing. Here, the sense amplifier and the precharge circuit have the same circuit construction, but since a precharging transistor of the sense amplifier is different in size from a precharging transistor of the precharge circuit, the sense amplifier and the precharge circuit have different bit-line precharging capabilities.

The shown semiconductor memory also comprises a virtual ground and precharge circuit 10 connected to the memory cell array 20. The virtual ground and precharge circuit 10 is controlled by a Y decoder 4B which fetches the address 11 in response to the CAS signal to decode the fetched address for selecting one memory at a column side, so that a selected digit line 60B is connected to either a ground or the precharge circuit.

Furthermore, the memory cell array 20 is associated with a bank selector 3 which fetches the address 11 in response to the CAS signal to decode the fetched address for selecting the memory cell 21.

As shown in FIG. 2, at one end of the bit lines 13 in the memory cell array 20 (at an upper end in the drawing), the bit lines 13 are connected every other one to a drain of switching transistors 33A and 33B in such a manner that each one pair of bit lines 13 placing therebetween one bit line that is not connected to the switching transistor 33A or 33B are connected through a pair of switching transistors 33A and 33B having their source connected in common to one bit line 60A which is connected to the sense amplifier and precharge circuit 6.

Furthermore, a pair of bank select lines 32A and 32B extend in a row direction in a region between the memory cell array 20 and the sense amplifier and precharge circuit 6, and are connected to a gate of the switching transistors 33A and 33B, respectively, as shown in FIG. 2. Opposite ends of each bank select line 32A or 32B are connected to respective outputs of a pair of bank select drivers 3A and 3B which are located at the opposite ends of each bank select line, respectively. Each of the bank select drivers 3A and 3B comprises a NAND circuit 30 receiving the address and an inverter 31 having an input connected to an output of the NAND circuit 30 and an output connected to a corresponding bank select line 32A or 32B. Thus, when a corresponding address is inputted, a selected bank select line 32A or 32B is precharged simultaneously by the pair of bank select drivers 3A and 3B connected to the opposite ends of the selected bank select line 32A or 32B, respectively.

Furthermore, as shown in FIG. 2, at the other end of the bit lines 13 in the memory cell array 20 (at a lower end in the drawing), the bit lines 13 are connected every other one to a source of switching transistors 33C and 33D in such a manner that each one pair of bit lines 13 which are not connected to the switching transistors 33A or 33B and which place therebetween one bit line connected to the switching transistor 33A or 33B are connected through a pair of switching transistors 33C and 33D having their drain connected in common to one bit line 60B which is connected to the virtual ground and precharge circuit 10.

Furthermore, a pair of bank select lines 32C and 32D extend in a row direction in a region between the memory cell array 20 and the virtual ground and precharge circuit 10, and are connected to a gate of the switching transistors 33C and 33D, respectively, as shown in FIG. 2. Opposite ends of each bank select line 32C or 32D are connected to respective outputs of a pair of bank select drivers 3C and 3D which are located at the opposite ends of each bank select line, respectively. Each of the bank select drivers 3C and 3D comprises a NAND circuit 30 receiving the address and an inverter 31 having an input connected to an output of the NAND circuit 30 and an output connected to a corresponding bank select line 32C or 32D. Thus, when a corresponding address is inputted, a selected bank select line 32C or 32D is precharged simultaneously by the pair of bank select drivers 3C and 3D connected to the opposite ends of the selected bank select line 32C or 32D, respectively.

Furthermore, the sense amplifier and precharge circuit 6 is connected to a latch circuit 7 for latching data outputted from the sense amplifier and precharge circuit 6. This latch circuit 7 outputs the latched data to an output buffer 8 at a final clock timing of a CAS latency (the number of clock cycles from the moment the CAS signal is inputted to the moment the data is actually outputted).

In addition, the sense amplifier and precharge circuit 6 is connected through a reference Y-selector 50 to a reference cell array 9 having the same structure as that of the memory cell array 20. The reference Y-selector 50 selects in the reference cell array 9 a reference cell designated by the word line selected by the X-decoder 2, and on the other hand, the reference Y-selector 50 is not controlled by the Y-decoder so that the reference cell is fixed in connection with the column address. A reference signal RA is outputted from the selected reference cell to the sense amplifier in which the output signal of the memory cell selected in the memory cell array 20 is compared with the reference signal RA in order to discriminate which of the high level and the low level the output signal of the selected memory cell is.

After the address of the memory cell 21 to be selected is established by the Y selector 5 and the X decoder 2, an equalize signal EQ is generated and supplied to the sense amplifier. This equalize signal EQ is generated at such a timing that after the data of the selected memory cell 21 is established, a voltage is changed to activate the sense amplifier.

Figure 3:
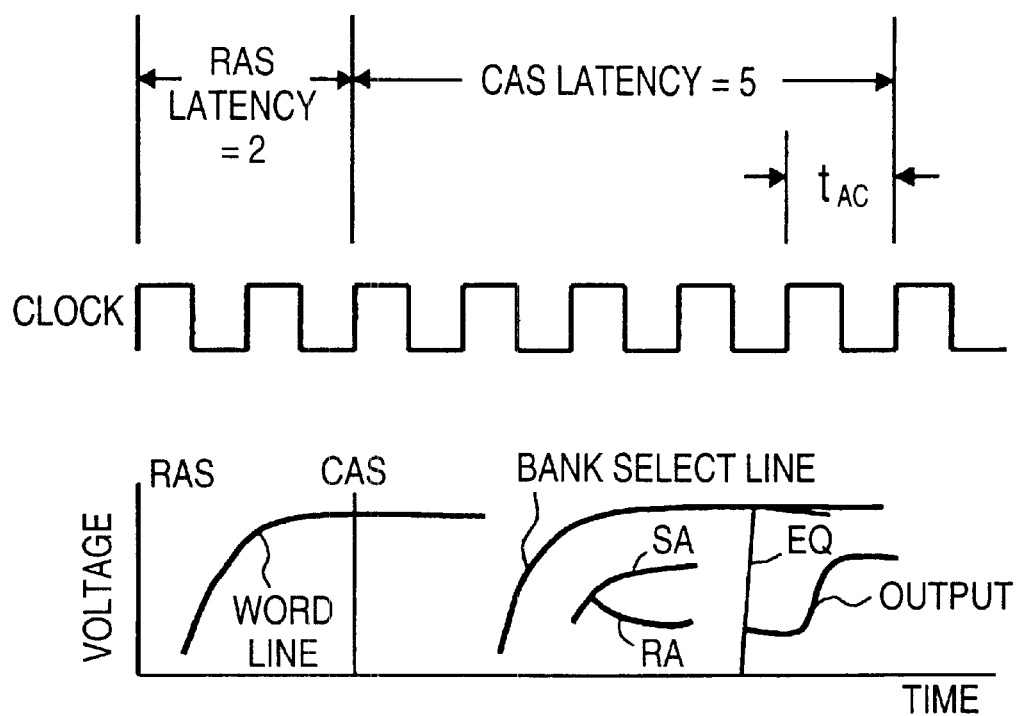
FIG. 3 is a timing chart illustrating a fetching of the RAS address and the CAS address and an outputting of data.
Figure 4:
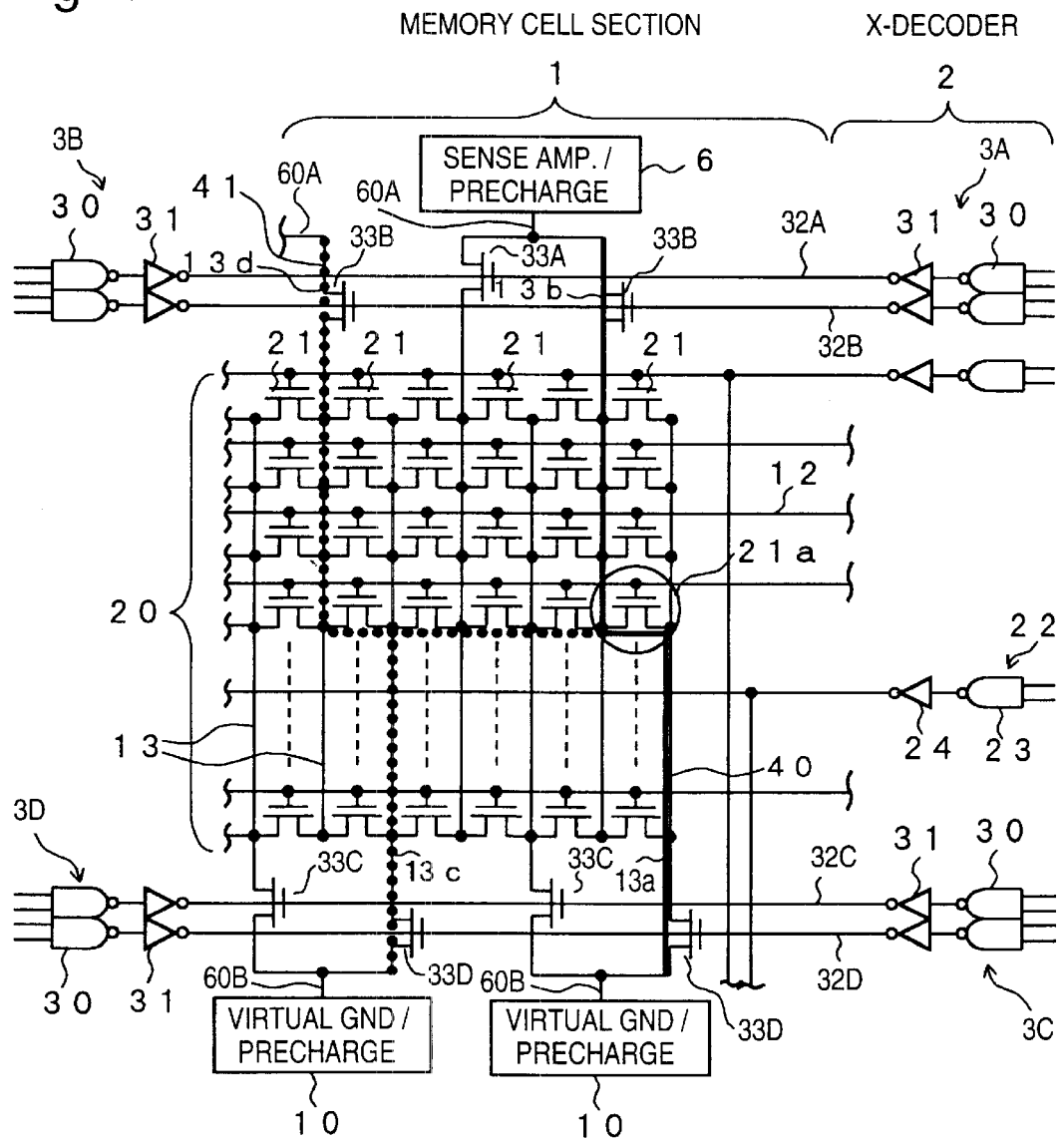
FIG. 4 is a circuit diagram showing a current path in the embodiment of the semiconductor memory in accordance with the present invention.

Now, an operation of the above mentioned semiconductor memory will be described with reference to FIGS. 3 and 4. FIG. 3 is a timing chart illustrating a fetching of the RAS address and the CAS address and an outputting of data. The axis of ordinates shows the voltage, and the axis of abscissas indicates the time. FIG. 4 is a circuit diagram similar to FIG. 2, showing a current path in the semiconductor memory shown in FIG. 2.

Since the shown semiconductor memory is a synchronous mask ROM, a clock signal is supplied at a constant clock frequency. Here, assume that the clock frequency is 100 MHz (one cycle is 10 ns), the RAS latency is 2, and the CAS latency is 5.

As shown in FIG. 3, in response to the RAS signal, an X address is fetched in the X decoder 2, which then decodes the fetched X address to select and rise up one word line from the plurality of word lines 12.

Thereafter, in response to the CAS signal, a Y address is fetched in the Y decoders 4A and 4B, which then decode the fetched Y address to select one bit line from the plurality of bit lines by means of the Y selector 5, so that one digit line 60A and one digit line 60B are selected. Thus, the address of the memory cell 21 to be selected is established.

Furthermore, in response to the CAS signal, the Y address is fetched in the bank selector 3, so that the bank select drivers 3A to 3D corresponding to the fetched address are selected and activated. In the example shown in FIG. 4, the bank select drivers 3A and 3B connected to the opposite ends of the bank select line 32B and the bank select drivers 3C and 3D connected to the opposite ends of the bank select line 32D are selected and activated, with the result that the bank select lines 32B and 32D are raised up. If the bank select lines 32B and 32D are raised up, a current flows from the precharge circuit to the bit lines 13, as shown by the dotted line 41 in FIG. 4. Specifically, the bit lines 13c and 13d other than the bit lines 13a and 13b connected to the selected memory cell 21a are precharged from two directions through the digit lines 60A and 60B and the switching transistors 33B and 33D turned on by the two activated bank select lines 32B and 32D, and the bit line 13b connected to the selected memory cell 21 is precharged from one direction, as shown by the thick solid line 40 in FIG. 4. In addition, if the selected memory cell 21a is an on-cell which is turned on by the raised-up word line 12, the bit line 13a connected to the selected memory cell 21 is further precharged, also as shown by the thick solid line 40 in FIG. 4. In this operation, since the bit lines 13c and 13d are precharged from the precharge circuits, the current supplied from the sense amplifier is prevented from flowing into non-selected bit lines.

When the selected memory cell 21a is an on-cell which is turned on by the raised-up word line 12, the current flowing from the sense amplifier to the bit line 12b passes through the memory cell 21a and the bit line 13a to the virtual ground. On the other hand, when the selected memory cell 21a is an off-cell which is never turned on by the raised-up word line 12, after the precharge of the bit lines 13c and 13d is completed, the current becomes not flowing through the memory cell 21a. As a result, the sense amplifier detects the current flowing through the memory cell 21a.

After the address of the selected memory cell 21 is established, the equalize signal EQ is generated to the sense amplifier, and the reference voltage RA is supplied to the sense amplifier from one reference cell selected by the reference Y-selector 50 from the reference cell array 9. An output voltage of the memory cell 21a is compared with the reference voltage RA by the sense amplifier, so that the sense amplifier discriminates which of the high level and the low level the output voltage of the memory cell 21a is, with the result that the data of the memory cell 21a is established. Thereafter, the voltage of the equalize signal EQ is elevated to activate the sense amplifier, so that the data is amplified by the sense amplifier.

This amplified data is transferred and latched in the latch circuit 7, and then, the latched data is outputted to the output buffer 8 at a fifth clock in the CAS latency, as shown in FIG. 3.

In this embodiment, since each selected bank select line 32A to 32D is precharged and raised up by the two bank select drivers 3A and 3B or 3C and 3D which are respectively located at the opposite end sides of each bank select line, the rising-up time of the bank select line 32A to 32D can be shortened. Therefore, the bit lines 13 having a capacitance larger than that of the digit lines can surely precharged for a shortened time, with the result that the it is possible to shorten a data reading time from the moment the address is fetched in response to the RAS signal to the moment the read-out data is latched in the latch circuit 7. Namely, the data reading operation of the semiconductor memory can be speeded up.

Furthermore, since the selected bank select line is driven by the two bank select drivers which are respectively located at the opposite end sides of each bank select line, even if the selected bank select line is long, it is possible to speed up the data reading operation of the semiconductor memory. In addition, even if the size of the memory cell array 20 is enlarged so that the bit lines 13 are elongated, it is possible to prevent the drop of the data reading speed. Accordingly, it is effective even if the bit lines 13 having a large capacitance is elongated.

As seen from the above, according to the present invention, since the bank select drivers are located at the opposite end sides of the bank select line, the bank select line can be raised up more quickly, so that the bit lines having a large capacitance is further quickly or surely precharged, with the result that the data reading operation from the fetching of the address to a data latching of an output stage can be quickened.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor memory comprising:
   a memory cell array including a number of memory cells arranged in a matrix having a plurality of rows and a plurality of columns;
   a plurality of word lines each connected to a plurality of memory cells of a corresponding row of said plurality of rows in said memory cell array;
   a plurality of bit lines each connected to a plurality of memory cells of a corresponding column of said plurality of columns in said memory cell array;
   a row address decoder fetching an address in response to a row address strobe signal to decode the fetched address and to select one word lines from said plurality of word lines;
   a column address decoder fetching the address in response to a column address strobe signal to decode the fetched address;
   a column selection switch receiving the decoded address from said column address decoder for selecting one bit line from said plurality of bit lines;
   a sense amplifier for precharging the bit line of a memory cell selected by said row address decoder and said column address decoder;
   a precharge circuit for precharging the bit line of a non-selected memory cell; and
   a pair of bank select drivers fetching the address in response to said column address strobe signal for raising up a bank select line for turning on a switch between the bit lines and a digit line, said pair of bank select drivers being located at opposite end sides of said bank select line.

2. A semiconductor memory claimed in claim 1 wherein one of said pair of bank select drivers is located at a row address decoder side of said memory cell array, and the other of said pair of bank select drivers is located at a side of said memory cell array opposite to said row address decoder side.

3. A semiconductor memory claimed in claim 2 wherein said memory cell array is of the NOR type.

4. A semiconductor memory claimed in claim 2 wherein said memory cells are of a flat cell structure.

5. A semiconductor memory claimed in claim 2 wherein said sense amplifier receives an equalizing signal for changing over said sense amplifier between an activated condition and a deactivated condition.

6. A semiconductor memory claimed in claim 1 further including a reference cell having the same structure as that of said memory cells and connected to said sense amplifier for supplying a reference voltage used for discriminating which of a high level and a low level an output of the selected memory cell is.

7. A semiconductor memory claimed in claim 6 wherein said memory cell array is of the NOR type.

8. A semiconductor memory claimed in claim 7 wherein said memory cells are of a flat cell structure.

9. A semiconductor memory claimed in claim 8 wherein said sense amplifier receives an equalizing signal for changing over said sense amplifier between an activated condition and a deactivated condition.

10. A semiconductor memory claimed in claim 6 wherein said memory cells are of a flat cell structure.

11. A semiconductor memory claimed in claim 6 wherein said sense amplifier receives an equalizing signal for changing over said sense amplifier between an activated condition and a deactivated condition.

12. A semiconductor memory claimed in claim 1 wherein said memory cell array is of the NOR type.

13. A semiconductor memory claimed in claim 1 wherein said memory cells are of a flat cell structure.

14. A semiconductor memory claimed in claim 1 wherein said sense amplifier receives an equalizing signal for changing over said sense amplifier between an activated condition and a deactivated condition.

* * * * *